(12) United States Patent
Farmer et al.

(10) Patent No.: US 10,665,798 B2
(45) Date of Patent: May 26, 2020

(54) CARBON NANOTUBE TRANSISTOR AND LOGIC WITH END-BONDED METAL CONTACTS

(71) Applicant: International Business Machines Corporation, Armonk, NY (US)

(72) Inventors: Damon B. Farmer, White Plains, NY (US); Shu-Jen Han, Cortlandt Manor, NY (US); Jianshi Tang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 15/210,463

(22) Filed: Jul. 14, 2016

(65) Prior Publication Data
US 2018/0019282 A1 Jan. 18, 2018

(51) Int. Cl.
- H01L 29/06 (2006.01)
- H01L 51/10 (2006.01)
- H01L 51/00 (2006.01)
- H01L 51/05 (2006.01)

(52) U.S. Cl.
CPC ........ H01L 51/105 (2013.01); H01L 51/0011 (2013.01); H01L 51/0048 (2013.01); H01L 51/0512 (2013.01)

(58) Field of Classification Search
CPC .................. H01L 21/02606; H01L 29/0669
USPC ................ 438/149, 154, 164, 199; 977/938; 257/29
See application file for complete search history.

(56) References Cited

U.S. PATENT DOCUMENTS

| | | | | |
|---|---|---|---|---|
| 6,706,566 B2 * | 3/2004 | Avouris | ................. | B82Y 10/00 438/105 |
| 6,723,624 B2 | 4/2004 | Wang et al. | | |
| 6,891,227 B2 * | 5/2005 | Appenzeller | .......... | B82Y 10/00 257/346 |
| 6,933,222 B2 * | 8/2005 | Dubin | .................... | B82Y 10/00 257/E21.404 |
| 7,076,871 B2 * | 7/2006 | Horiuchi | ................. | B82Y 10/00 204/192.38 |

(Continued)

OTHER PUBLICATIONS

Che et al., "Review of carbon nanotube nanoelectronics and macroelectronics", Semiconductor Science and Technology 29 (2014) 073001.*

(Continued)

*Primary Examiner* — Jay C Kim (74) *Attorney, Agent, or Firm* — Vazken Alexanian; Ryan, Mason & Lewis, LLP (57) ABSTRACT

A method for manufacturing a semiconductor device includes forming a dielectric layer on a substrate, forming a first carbon nanotube (CNT) layer on the dielectric layer at a first portion of the device corresponding to a first doping type, forming a second CNT layer on the dielectric layer at a second portion of the device corresponding to a second doping type, forming a plurality of first contacts on the first CNT layer, and a plurality of second contacts on the second CNT layer, performing a thermal annealing process to create end-bonds between the plurality of the first and second contacts and the first and second CNT layers, respectively, depositing a passivation layer on the plurality of the first and second contacts, and selectively removing a portion of the passivation layer from the plurality of first contacts.

15 Claims, 10 Drawing Sheets

(56) References Cited

U.S. PATENT DOCUMENTS

| | | | | |
|---|---|---|---|---|
| 7,141,727 | B1* | 11/2006 | Appenzeller | B82Y 10/00 257/20 |
| 7,233,071 | B2* | 6/2007 | Furukawa | B82Y 10/00 257/759 |
| 7,253,065 | B2 | 8/2007 | Appenzeller et al. | |
| 7,253,431 | B2* | 8/2007 | Afzali-Ardakani | B82Y 10/00 257/20 |
| 7,492,015 | B2* | 2/2009 | Chen | B82Y 10/00 257/369 |
| 7,598,516 | B2 | 10/2009 | Avouris et al. | |
| 7,714,386 | B2* | 5/2010 | Pesetski | B82Y 10/00 257/347 |
| 7,732,859 | B2* | 6/2010 | Anderson | H01L 29/1606 257/328 |
| 7,786,024 | B2* | 8/2010 | Stumbo | B23K 26/073 438/795 |
| 7,786,466 | B2* | 8/2010 | Appenzeller | B82Y 10/00 257/14 |
| 7,847,588 | B2* | 12/2010 | Bertin | B82Y 10/00 326/39 |
| 7,897,960 | B2* | 3/2011 | Appenzeller | B82Y 10/00 257/24 |
| 8,004,043 | B2* | 8/2011 | Keshavarzi | B82Y 10/00 257/369 |
| 8,022,725 | B2* | 9/2011 | Kim | B82Y 10/00 326/49 |
| 8,063,451 | B2* | 11/2011 | Zhang | B82Y 10/00 257/330 |
| 8,120,008 | B2* | 2/2012 | Peng | B82Y 10/00 257/10 |
| 8,227,799 | B2* | 7/2012 | Liu | B82Y 10/00 257/288 |
| 8,288,759 | B2* | 10/2012 | Chen | B82Y 10/00 257/24 |
| 8,288,804 | B2* | 10/2012 | Kikuchi | B82Y 10/00 257/288 |
| 8,297,351 | B2 | 10/2012 | Yoshiuchi et al. | |
| 8,354,291 | B2* | 1/2013 | Zhou | B82Y 10/00 257/E21.009 |
| 8,362,525 | B2* | 1/2013 | Bertin | B82Y 10/00 257/213 |
| 8,420,474 | B1* | 4/2013 | Frank | H01L 27/1203 438/155 |
| 8,445,893 | B2* | 5/2013 | Meric | H01L 29/1606 257/29 |
| 8,471,249 | B2 | 6/2013 | Chiu et al. | |
| 8,487,297 | B2* | 7/2013 | Subagyo | B82Y 10/00 257/29 |
| 8,502,277 | B2* | 8/2013 | Matsumoto | B82Y 10/00 257/213 |
| 8,580,586 | B2* | 11/2013 | Bertin | B82Y 10/00 365/100 |
| 8,609,481 | B1* | 12/2013 | Franklin | H01L 51/055 438/197 |
| 8,610,125 | B2* | 12/2013 | Kastalsky | H01L 33/04 257/13 |
| 8,610,989 | B2 | 12/2013 | Avouris et al. | |
| 8,617,941 | B2* | 12/2013 | Farmer | H01L 29/1606 257/27 |
| 8,796,096 | B2* | 8/2014 | Farmer | H01L 29/1606 216/81 |
| 8,901,666 | B1* | 12/2014 | Meade | H01L 29/1606 257/369 |
| 8,969,118 | B2* | 3/2015 | Afzali-Ardakani | B82Y 30/00 257/E21.442 |
| 9,040,364 | B2* | 5/2015 | Farmer | H01L 21/02603 257/E51.04 |
| 9,082,856 | B2* | 7/2015 | Chen | H01L 29/4908 |
| 9,177,688 | B2 | 11/2015 | Bol et al. | |
| 9,287,516 | B2* | 3/2016 | Cao | H01L 51/0541 |
| 9,299,939 | B1* | 3/2016 | Cao | H01L 51/105 |
| 9,543,535 | B1* | 1/2017 | Afzali-Ardakani | H01L 51/0516 |
| 9,577,204 | B1* | 2/2017 | Han | H01L 51/0558 |
| 9,882,008 | B2* | 1/2018 | Colombo | H01L 29/401 |
| 10,396,300 | B2* | 8/2019 | Han | H01L 27/288 |
| 2004/0238887 | A1* | 12/2004 | Nihey | B82Y 10/00 257/347 |
| 2005/0224888 | A1* | 10/2005 | Graham | B82Y 10/00 257/368 |
| 2012/0280213 | A1* | 11/2012 | Gau | H01L 51/0048 257/29 |
| 2015/0348667 | A1* | 12/2015 | Bol | H01L 51/0048 428/408 |
| 2017/0133609 | A1* | 5/2017 | Cao | H01L 51/105 |

OTHER PUBLICATIONS

Grigoras et al., "Atomic Layer Deposition of Aluminum Oxide Films for Carbon Nanotube Network Transistor Passivation", Journal of Nanoscience and Nanotechnology 11 (2011) pp. 8818-8825.*

Kim et al., "Controlling the electronic properties of SWCNT FETs via modification of the substrate surface prior to atomic layer deposition of 10 nm thick Al2O3 film", Nanotechnology 24 (2013) 455701.*

Young et al., "Growth and Characterization of Al2O3 Atomic Layer Deposition Films on sp2-Graphitic Carbon Substrates Using NO2/Trimethylaluminum Pretreatment", Applied Materials & Interfaces 7 (2015) pp. 12030-12037.*

Wang et al., "Carbon nanotube electronics—moving forward", Chemical Society Review 42 (2013) pp. 2592-2609.*

Zavodchikova et al., "Carbon nanotube thin film transistors based on aerosol methods", Nanotechnology 20 (2009) 085201.*

Helbling et al., "Long term investigations of carbon nanotube transistors encapsulated by atomic-layer-deposited Al2O3 for sensor applications", Nanotechnology 20 (2009) 434010.*

Javey et al., "Carbon Nanotube Field-Effect Transistors with Integrated Ohmic Contacts and High-k Gate Dielectrics", Nano Letters 4 (2004) pp. 447-450.*

Rodriguez-Manzo et al., "Heterojunctions between metals and carbon nanotubes as ultimate nanocontacts", PNAS 106 (2009), pp. 4591-4595.*

"IBM Reports Carbon Nanotube Transistor Breakthrough", www.hpcwire.com (2015).*

Cao et al., "End-bonded contacts for carbon nanotube transistors with low, size-independent resistance", Science 350 (2015) pp. 68-72.*

"Fundamental Physical Aspects of Carbon Nanotube Transistors", a chapter of the book entitled "Carbon Nanotubes" edited by Jose Mauricio Marulanda (2010).*

Schroter et al., "Carbon Nanotube FET Technology for Radio-Frequency Electronics: State-of-the-Art Overview", IEEE Journal of the Electron Devices Society 1 (2013) pp. 9-20.*

Leonard et al., "Electrical contacts to one- and two-dimensional nanomaterials", Nature Nanotechnology 6 (2011) pp. 773-783.*

Misewich et al., "Electrically Induced Optical Emission from a Carbon Nanotube FET", Science 300 (2003) pp. 783-786.*

Q. Cao et al., "End-Bonded Contacts for Carbon Nanotube Transistors with Low, Size-Independent Resistance," Science, Oct. 2015, pp. 68-72, vol. 350, No. 6256.

Y. Zhang et al., "Heterostructures of Single-Walled Carbon Nanotubes and Carbide Nanorods," Science, Sep. 1999, pp. 1719-1722, vol. 285, No. 5434.

T.-J. Ha et al., "Highly Uniform and Stable N-Type Carbon Nanotube Transistors by Using Positively Charged Silicon Nitride Thin Films," Nano Letters, Jan. 2015, pp. 392-397, vol. 15, No. 1.

Z. Zhang et al., "Reverse Degradation of Nickel Graphene Junction by Hydrogen Annealing," AIP Advances, Jan. 2016, pp. 1-7, vol. 6.

U.S. Appl. No. 14/933,339, filed in the name of Q. Cao et al. on Nov. 5, 2015 and entitled "End-Bonded Metal Contacts on Carbon Nanotubes."

U.S. Appl. No. 14/957,664, filed in the name of S.-J. Han et al. on Dec. 3, 2015 and entitled "Carbon Nanotube Device with N-Type End-Bonded Metal Contacts."

(56) References Cited

OTHER PUBLICATIONS

List of IBM Patents or Patent Applications Treated as Related.
Banhart, "Interactions Between Metals and Carbon Nanotubes: at the Interface Between Old and New Materials," Nanoscale, 2009, pp. 201-213, vol. 1.
Cha et al., "Three-Dimensional Imaging of Carbon Nanotubes Deforemed by Metal Islands," Nano Letters, 2007, pp. 3770-3773, vol. 7.
Perebeinos et al., "Carbon Nanotube Deformation and Collapse under Metal Contacts," Nano Letters, 2014, pp. 4376-4380, vol. 14.

* cited by examiner

FIG. 9B
WITH PASSIVATION

FIG. 9A
WITHOUT PASSIVATION

CARBON NANOTUBE TRANSISTOR AND LOGIC WITH END-BONDED METAL CONTACTS

CROSS-REFERENCE TO RELATED APPLICATION

This application is related to U.S. patent application Ser. No. 15/210,491, filed on Jul. 14, 2016, which is commonly assigned, and entitled "N-Type End-Bonded Metal Contacts For Carbon Nanotube Transistors", the complete disclosure of which is expressly incorporated herein by reference in its entirety for all purposes.

TECHNICAL FIELD

The field generally relates to semiconductor devices and methods of manufacturing same and, in particular, to forming both p-type and n-type end-bonded metal contacts to carbon nanotubes (CNTs).

BACKGROUND

A metal-oxide-semiconductor field-effect transistor (MOSFET) is a transistor used for amplifying or switching electronic signals, and includes a metal oxide gate electrode. N-type field effect transistors (NFETs) and p-type field effect transistors (PFETs) are two types of complementary MOSFETs. An NFET includes n-doped source/drain regions and utilizes electrons as current carriers, whereas a PFET includes p-doped source/drain regions and uses holes as current carriers.

Complementary metal-oxide semiconductor (CMOS) technology is being continuously scaled down with respect to device channel length and contact length. As the channel length reaches tens of nanometers, contact resistance can become comparable with channel resistance, and gradually limit transistor drive current.

Due to its superior electrical properties and intrinsic ultra-thin body, carbon nanotube (CNT) is widely considered as one of the most promising candidates to replace silicon for sub-5 nm technology nodes. CNT-based CMOS technology requires a scalable transistor channel and scalable and robust source/drain contacts for both PFETs and NFETs. For this purpose, end-bonded source/drain metal contacts to CNTs, featuring a length-independent contact resistance, represent a preferred contact scheme over side contacts for scaled technology nodes.

SUMMARY

According to an exemplary embodiment of the present invention, a method for manufacturing a semiconductor device includes forming a dielectric layer on a substrate, forming a first carbon nanotube (CNT) layer on the dielectric layer at a first portion of the device corresponding to a first doping type, forming a second carbon nanotube (CNT) layer on the dielectric layer at a second portion of the device corresponding to a second doping type, forming a plurality of first contacts on the first carbon nanotube (CNT) layer, and a plurality of second contacts on the second carbon nanotube (CNT) layer, performing a thermal annealing process to create end-bonds between the plurality of the first and the second contacts and the first and second carbon nanotube (CNT) layers, respectively, depositing a passivation layer on the plurality of the first and second contacts, and selectively removing a portion of the passivation layer from the plurality of first contacts.

According to an exemplary embodiment of the present invention, a semiconductor device includes a dielectric layer on a substrate, a first carbon nanotube (CNT) layer on the dielectric layer at a first portion of the device corresponding to a first doping type, a second carbon nanotube (CNT) layer on the dielectric layer at a second portion of the device corresponding to a second doping type, a plurality of first contacts end-bonded to the first carbon nanotube (CNT) layer, and a plurality of second contacts end-bonded to the second carbon nanotube (CNT) layer, and a passivation layer on the plurality of the second contacts without being on the plurality of the first contacts.

According to an exemplary embodiment of the present invention, a method for manufacturing a semiconductor device includes forming a dielectric layer on a substrate, forming a carbon nanotube (CNT) layer on the dielectric layer, wherein a first portion of the carbon nanotube (CNT) layer corresponds to a first doping type, and a second portion of the carbon nanotube (CNT) layer corresponds to a second doping type, forming a plurality of first contacts on the first portion of the carbon nanotube (CNT) layer, and a plurality of second contacts on the second portion of the carbon nanotube (CNT) layer, performing a thermal annealing process to create end-bonds between the plurality of the first and the second contacts and the first and second portions of the carbon nanotube (CNT) layer, respectively, depositing a passivation layer on the plurality of the first and second contacts, and selectively removing a portion of the passivation layer from the plurality of first contacts.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to forming both p-type and n-type end-bonded metal contacts to carbon nanotubes (CNTs).

While there exist approaches to making p-type end-bonded contacts to CNTs, methods of making devices and devices incorporating robust n-type end-bonded contacts to CNTs are needed. Embodiments of the present invention relate to a method of forming robust n-type end-bonded metal contacts to CNTs by depositing a passivation layer on originally p-type contacts. The passivation layer functions as an n-type physicochemical doping layer. As a result, CNT logic (e.g., an inverter) with both end-bonded p- and n-type contacts can be formed.

It is to be understood that the various layers and/or regions shown in the accompanying drawings are not drawn to scale, and that one or more layers and/or regions of a type commonly used in complementary metal-oxide semiconductor (CMOS), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or other types of FETs. By way of non-limiting example, the semiconductor devices can include, but are not limited to CMOS and MOSFET devices, and/or semiconductor devices that use CMOS and MOSFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 1:
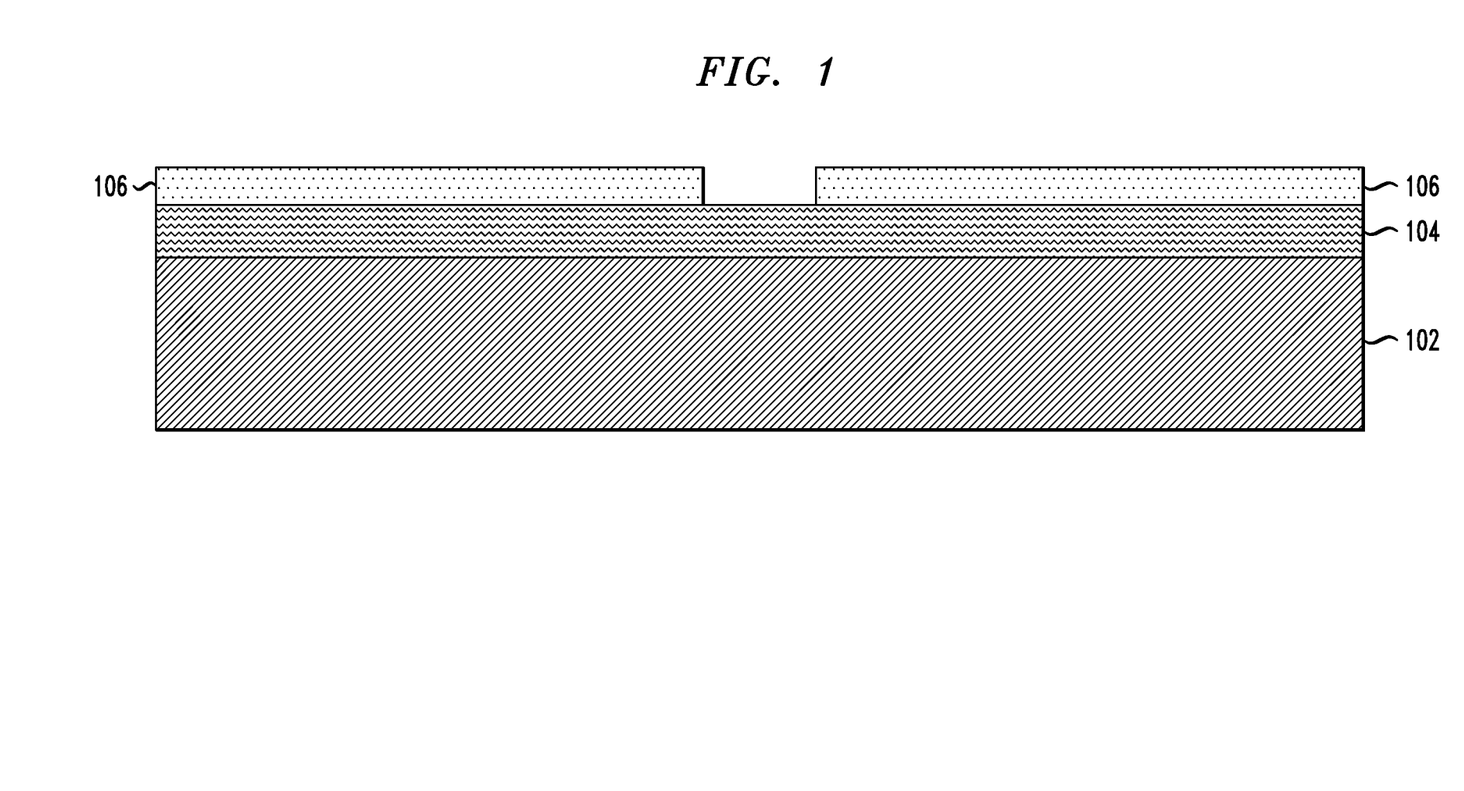
FIG. 1 is a cross-sectional view illustrating carbon nanotube (CNT) layers on a dielectric layer on a substrate in a method for manufacturing a semiconductor device, according to an exemplary embodiment of the present invention.

FIG. 1 is a cross-sectional view illustrating carbon nanotube (CNT) layers on a dielectric layer on a substrate in a method for manufacturing a semiconductor device, according to an exemplary embodiment of the present invention. Referring to FIG. 1, the semiconductor device includes a substrate 102 with a dielectric layer 104 formed on the substrate 102. The substrate can be, for example, a silicon, a silicon germanium, or any other substrate, and can include dopants such as p-type dopants, including, but not necessarily limited to, boron, n-type dopants, including, but not necessarily limited to, phosphorus, or any combination thereof. Non-limiting examples of the substrate 102 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

The dielectric layer 104 can be deposited on the substrate 102 using deposition techniques, including, but not necessarily limited to, chemical vapor deposition (CVD), plasma-enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating. The dielectric layer 104 can be formed of a high-k gate dielectric. In some aspects, the dielectric layer can include a low-k dielectric oxide, including but not limited to, spin-on-glass, a flowable oxide, a high density plasma oxide, or any combination thereof. Additionally, the dielectric layer 104 can be silicon dioxide, tetraethylorthosilicate (TEOS) oxide, high aspect ratio plasma (HARP) oxide, silicon oxide, high temperature oxide (HTO), high density plasma (HDP) oxide, oxides formed by an ALD process, or any combination thereof, and insulating liners, for example, silicon nitride (SiN), SiOCN, or SiBCN.

The substrate 102 can have a height of, for example, about 100 microns (μm) to about 500 microns (μm) from a bottom surface to a top surface of the substrate 102. The dielectric layer 104 can have a height of about 2 nanometers (nm) to about 300 nanometers (nm) from a bottom surface to a top surface of the dielectric layer 104.

FIG. 1 also illustrates carbon nanotube (CNT) layers 106 disposed on the dielectric layer 104. The CNT layers 106 can include, but are not necessarily limited to, highly-purified carbon nanotube materials with various densities, and can be formed by drop casting a CNT solution on the dielectric layer 104. Alternatively, the CNT layers 106 can be formed by aligning or growing CNTs on the dielectric layer 104. As can be seen, according to an embodiment, CNT layers 106 can be spaced apart from each other, to correspond to PFET and NFET portions of a device. In another embodiment, a continuous CNT layer can be used with PFET and NFET portions on different parts of the continuous CNT layer.

Figure 2:
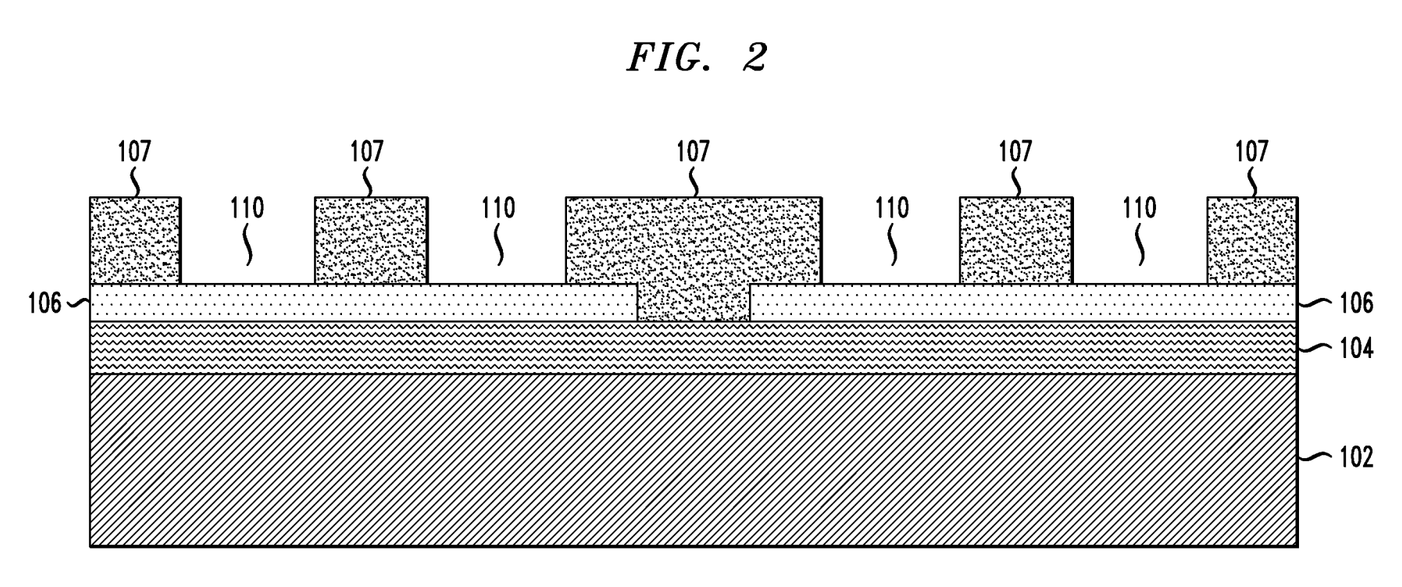
FIG. 2 is a cross-sectional view illustrating a dielectric layer formed on CNT layers, and trenches formed in the dielectric layer, in a method for manufacturing a semiconductor device, according to an exemplary embodiment of the present invention.

FIG. 2 is a cross-sectional view illustrating a dielectric layer formed on CNT layers, and trenches formed in the dielectric layer, in a method for manufacturing a semiconductor device, according to an exemplary embodiment of the present invention. Referring to FIG. 2, a dielectric layer 107 comprising, for example, hydrogen silsesquioxane (HSQ), is deposited on the CNT layers 106 and a portion of the dielectric layer 104 using any suitable method including, but not necessarily limited to, PECVD, ALD, or spin-coating and baking onto the underlying layer(s). The dielectric layer 107 protects portions of the device, including the CNT layers 106, when, for example, depositing subsequent layers on the device.

According to an embodiment of the present invention, portions of the dielectric layer 107 are removed using electron beam (e-beam) lithography to expose portions of the underlying CNT layers 106 in desired areas, forming trenches 110 where source/drain contact regions will be formed. Alternatively, a suitable etching process, such as, for example, isotropic or anisotropic etches, such as reactive ion etching (RIE), can be used to pattern the trenches 110.

Figure 3:
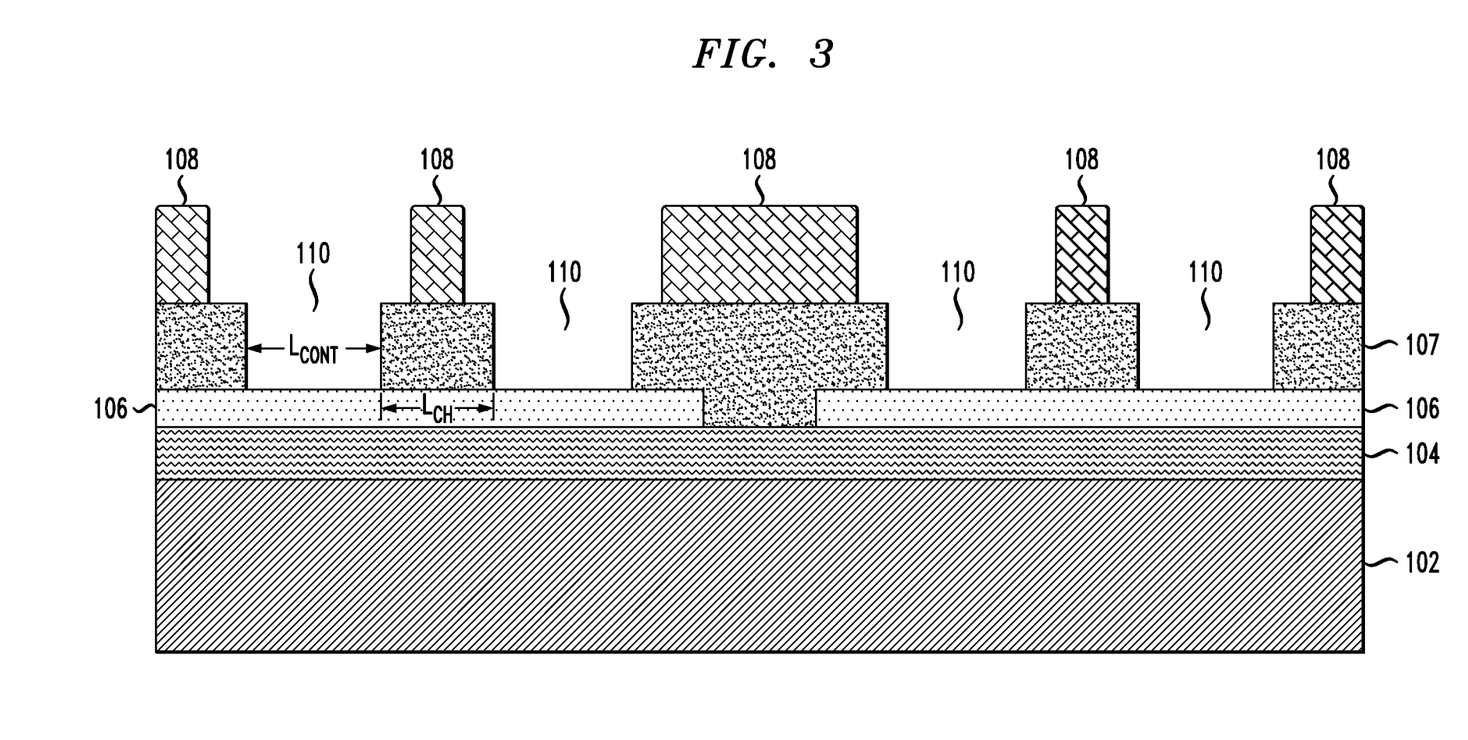
FIG. 3 is a cross-sectional view illustrating a patterned resist layer formed on the dielectric layer, in a method for manufacturing a semiconductor device, according to an exemplary embodiment of the present invention.

Referring to FIG. 3, according to embodiments of the present invention, the trenches 110 can have a contact length ($L_{cont}$) of about 5 nanometers (nm) to about 1000 nanometers (nm), such as, about 10 nanometers (nm) to about 100 nanometers (nm), but not necessarily limited thereto. As shown, more than one trench 110 can be formed. For example, multiple trenches 110 that are spaced apart from each other are illustrated at different portions of each of the CNT layers 106. The embodiments of the present invention are not limited to the illustrated number of trenches 110, and may include more or less trenches. According to an embodiment, a distance between each trench, or channel length ($L_{ch}$), can be, but is not necessarily limited to, about 5 nanometers (nm) to about 1000 nanometers (nm), such as, about 10 nanometers (nm) to about 150 nanometers (nm).

FIG. 3 is a cross-sectional view illustrating a resist 108 formed on portions of the dielectric layer 107, in a method for manufacturing a semiconductor device, according to an exemplary embodiment of the present invention. The resist 108 masks portions of the dielectric layer 107 when forming contact metal layers on the device. In accordance with an embodiment of the present invention, the resist 108 can be about 50 nanometers (nm) to about 1000 nanometers (nm) in height from a bottom surface to a top surface of the resist 108. The resist layer 108 can be deposited by any suitable method depending on the type of material, the methods including, but not necessarily limited to, PECVD, ALD, or spin-coating and baking onto the underlying layer(s).

In order to form the configuration shown in FIG. 3, portions of the resist 108 can be selectively removed by, for example, using electron beam lithography processing steps. For example, the resist 108 can be a polymethyl methacrylate (PMMA) resist, which is moldable and removable using electron beam lithography, but any other suitable resist can be used. According to embodiments of the present invention, the resist 108 can include, but is not necessarily limited to, a photoresist, electron-beam resist, ion-beam resist, X-ray resist, and an etchant resist, and may comprise polymeric spin-on or polymeric materials.

Figure 4:
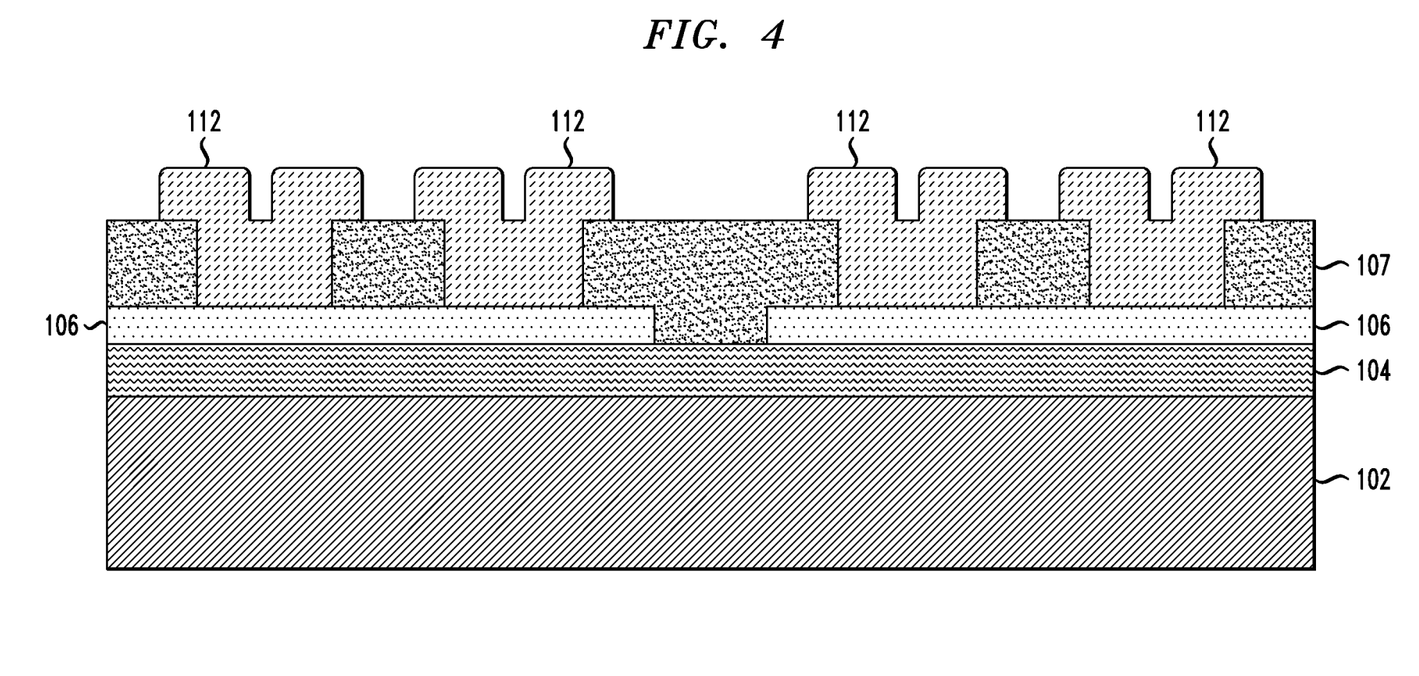
FIG. 4 is a cross-sectional view illustrating contact metal formation, in a method for manufacturing a semiconductor device, according to an exemplary embodiment of the present invention.

FIG. 4 is a cross-sectional view illustrating contact metal formation, in a method for manufacturing a semiconductor device, according to an exemplary embodiment of the present invention. Referring to FIG. 4, contact metal layers 112 are deposited between the remaining portions of the resist 108 and the dielectric layer 107 in the trenches 110 using, for example, a suitable deposition technique, such as, for example, CVD, PECVD, RFCVD, PVD, ALD, MLD, MBD, PLD, and/or LSMCD, sputtering, and/or plating. As shown in FIG. 4, following deposition of the contact metal 112, the resist 108 can be removed, or lifted off, from the dielectric layer 107 using, for example any suitable method of removing the resist 108 including, but not necessarily limited to, e-beam lithography, ashing and isopropyl alcohol (IPA) processing.

In some aspects, acetone, for example, hot acetone at a temperature of about 60° C.-about 80° C. can be used to lift-off the remaining resist 108. Additionally, in some aspects, the contact metal 112 can be planarized prior to or after removal of the resist 108. Planarization can be performed using, for example, chemical mechanical planarization (CMP).

Figure 5:
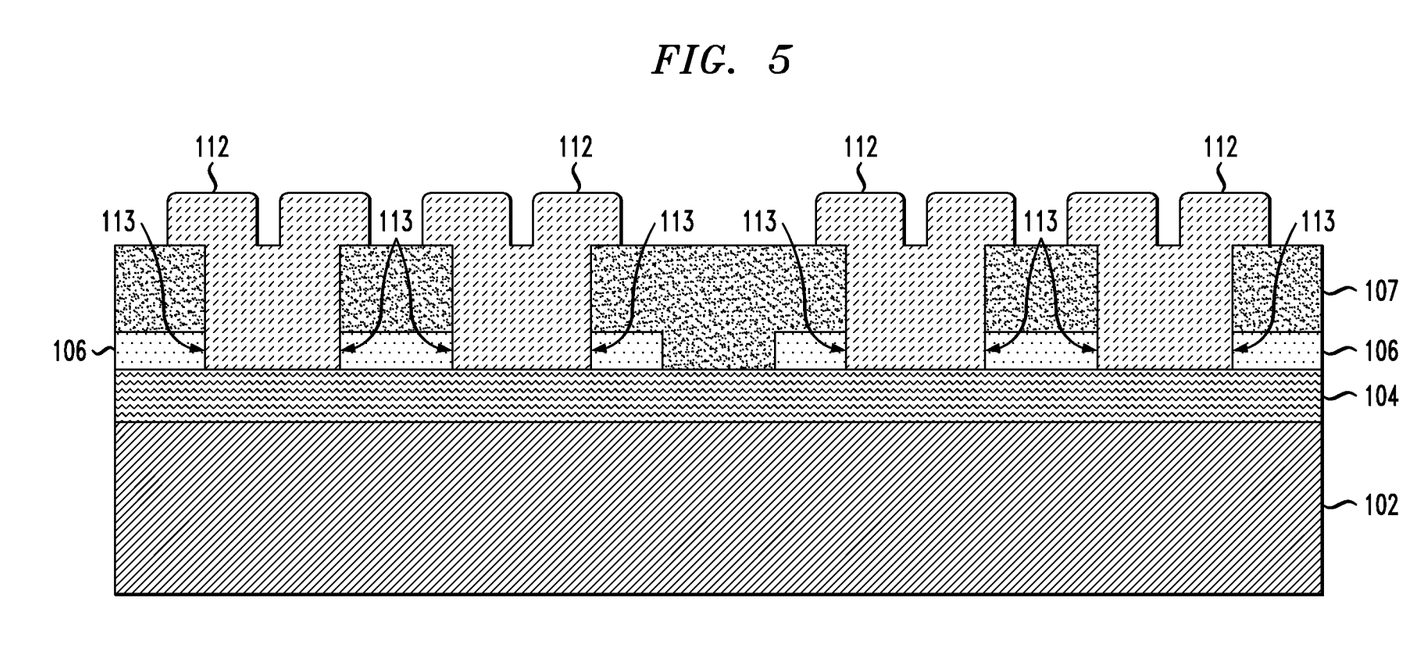
FIG. 5 is a cross-sectional view illustrating formation of end-bonded contacts following a thermal annealing process, in a method for manufacturing a semiconductor device, according to an exemplary embodiment of the present invention.

FIG. 5 is a cross-sectional view illustrating formation of end-bonded contacts following a thermal annealing process, in a method for manufacturing a semiconductor device, according to an exemplary embodiment of the present invention. Once the contacts 112 are deposited and the resist 108 is removed, a thermal annealing process is performed at a pre-determined temperature or temperature range to create end-bonds between the contacts 112 and the CNT layer 106 on which they are formed. As shown in FIG. 5, the thermal annealing process drives the CNT material to migrate or diffuse into the metal contacts 112, thereby creating an end-bonded contact 112 with contact interface surfaces 113 between a contact 112 and the CNT layer 106 only at ends of the contact 112 on lateral sides of the contacts 112. For example, according to an embodiment of the present invention, the carbon nanotubes that were beneath the contacts 112 are entirely dissolved into the contacts 112. The carbon nanotubes, which have a small diameter (e.g., ~1 nm), dissolve into contacts 112 having much larger dimensions relative to the carbon nanotubes to form end-bonded contacts.

The contacts 112, which function as source/drain contacts between channel regions for resulting transistors of the device, can be formed of any suitable metal. In some aspects, the contact metal has a sufficiently high solubility of carbon such that the CNT can dissolve into the metal contact during a thermal annealing process. In particular, the contact metal can be a metal that has a sufficiently high solubility of carbon such that the CNT can dissolve into the metal contact during a relatively low-temperature thermal annealing.

Additionally, the metal can be selected such that the metal does not form a carbide at relatively low thermal annealing temperatures. Specifically, thermal annealing steps are traditionally performed at high temperatures (such as greater than about 1000° C.) and relatively low thermal annealing temperatures are sought in order to lower the risk of damaging devices with the high temperatures. As such, in some aspects, the contact metal can be selected such that no carbides are formed during a thermal annealing process at a desired temperature of less than about 1000° C. By way of non-limiting example, a metal can be selected that does not form a carbide at a thermal annealing temperature of about 400° C. to about 600° C. Accordingly, the contact metal will form end-bonded metal contacts near the original contact edge and will not form a carbide contact surface.

A metal that has high CNT solubility and resists carbide formation at relatively low temperatures (e.g., about 400° C. to about 600° C.) can be used to form the contacts 112. In some aspects, the contacts 112 may comprise any of nickel (Ni), cobalt (Co), iron (Fe), copper (Cu), gold (Au), silver (Ag), ruthenium (Ru), palladium (Pd), platinum (Pt), iridium (Ir), and any mixtures or alloys thereof. For example, according to non-limiting embodiments of the present invention, the metal for the contacts 112 can be nickel. A contact length ($L_{cont}$) of the metal contacts 112 can be, for example, about 40 nm, but is not necessarily limited thereto. According to a non-limiting embodiment, the nickel contacts are annealed at about 500° C. for about 5 minutes.

Figure 6:
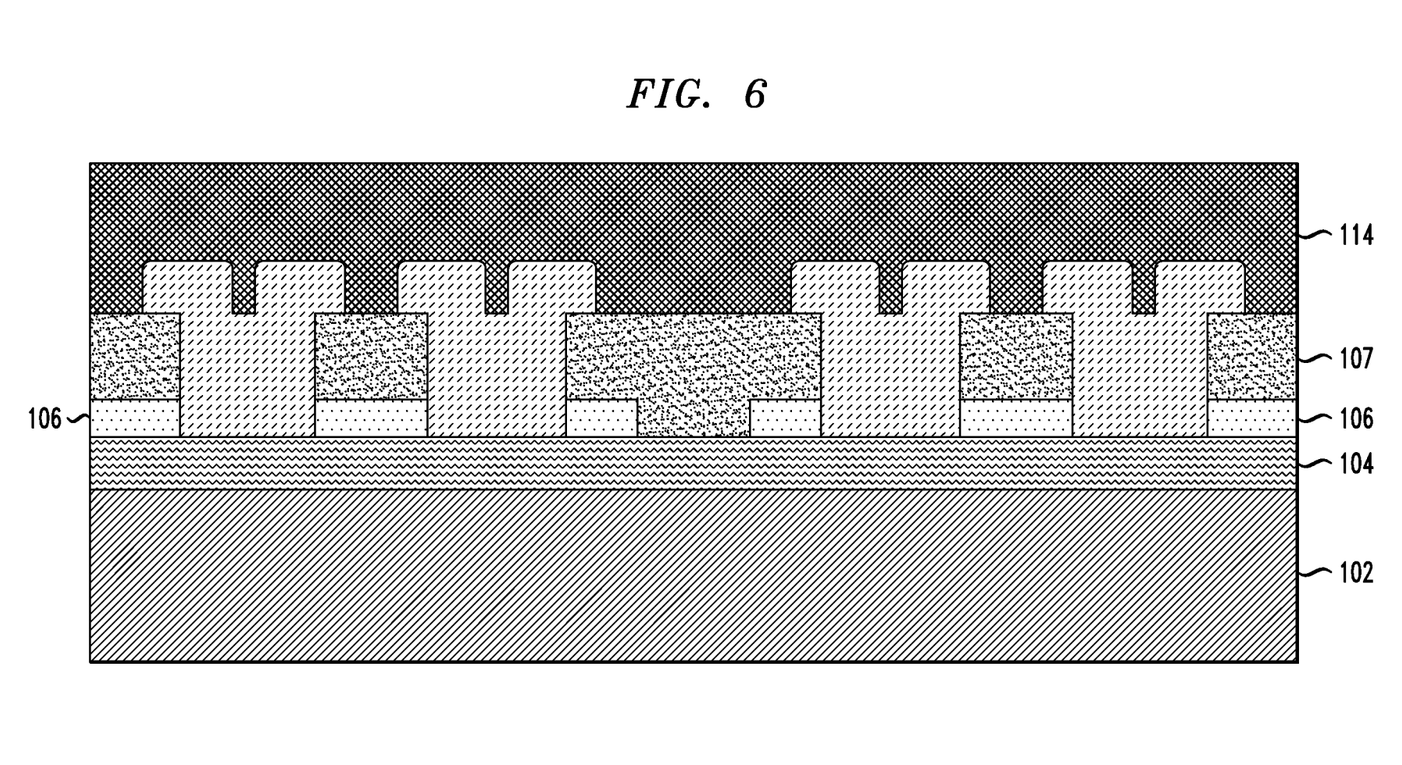
FIG. 6 is a cross-sectional view illustrating deposition of a passivation layer in a method for manufacturing a semiconductor device, according to an exemplary embodiment of the present invention.

FIG. 6 is a cross-sectional view illustrating deposition of a passivation layer in a method for manufacturing a semiconductor device, according to an exemplary embodiment of the present invention. Referring to FIG. 6, a passivation layer 114 is deposited on the contacts 112 and the dielectric layer 107. The passivation layer 114 is deposited using, for example, a suitable deposition technique, such as, for example, CVD, PECVD, RFCVD, PVD, ALD, MLD, MBD, PLD, and/or LSMCD, sputtering, and/or plating. The deposition technique may depend on the material used for the passivation layer 114. According to an embodiment of the present invention, the passivation layer 114 comprises a dielectric, such as, for example, an oxide or a nitride. For example, the passivation layer 114 includes, but is not necessarily limited to, aluminum oxide ($Al_2O_3$) or hafnium oxide ($HfO_2$) deposited using ALD. A height of the passivation layer 114 from a bottom surface to a top surface thereof can be in the range of about 5 nm to about 100 nm, for example, about 20 nm, depending on the height of the contacts 112 to allow a top surface of the passivation layer 114 to be higher than a top surface of the contacts 112.

Figure 7:
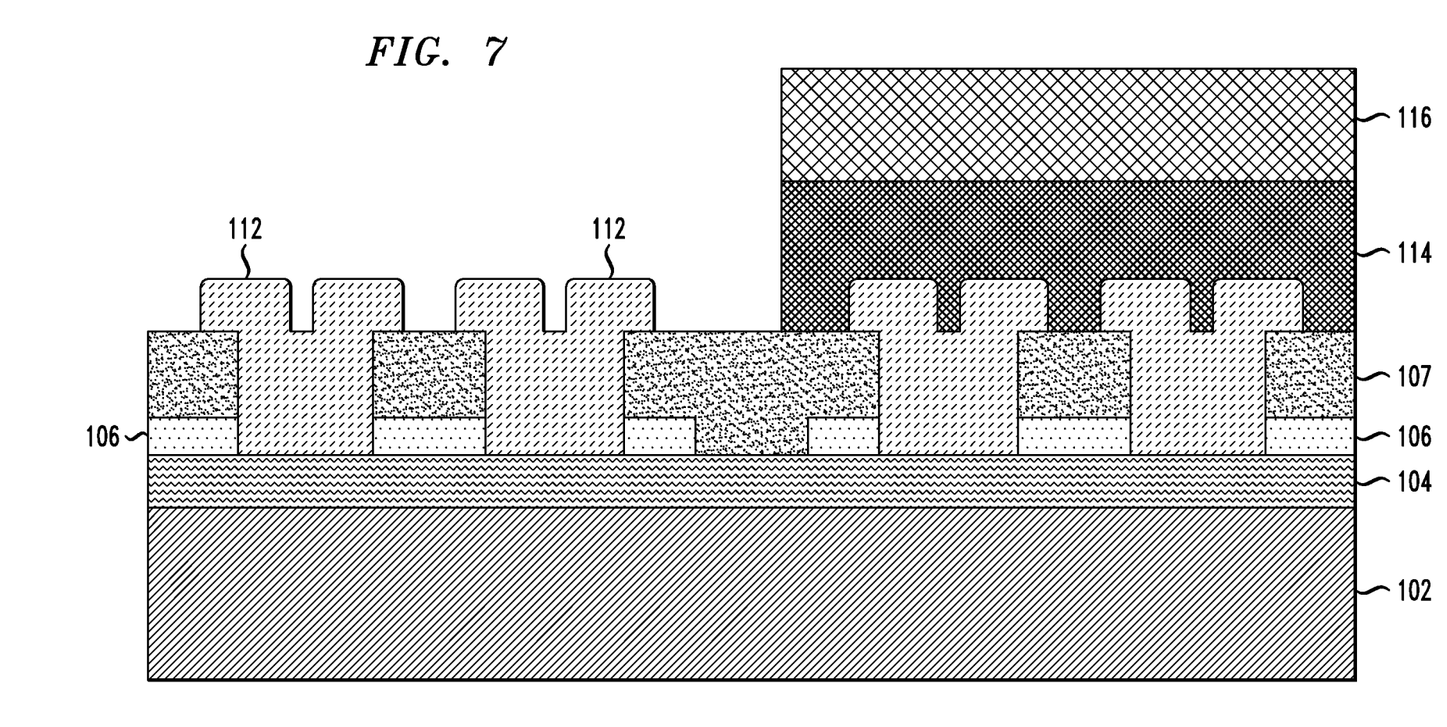
FIG. 7 is a cross-sectional view illustrating selective removal of part of the passivation layer, in a method for manufacturing a semiconductor device, according to an exemplary embodiment of the present invention.

FIG. 7 is a cross-sectional view, illustrating selective removal of part of the passivation layer, in a method for manufacturing a semiconductor device, according to an exemplary embodiment of the present invention. Referring to FIG. 7, a portion of the passivation layer 114 over a set of the contacts 112 on a CNT layer 106 is selectively removed using, for example, a mask 116 covering a portion of the passivation layer 114 that is to remain. According to an embodiment, the removal is performed using, for example, a buffered oxide etch (BOE) process, where a buffering agent, such as ammonium fluoride ($NH_4F$), and hydrofluoric acid (HF) and/or hydrochloric acid (HCl) are used. Other wet etchants can include, but are not necessarily limited to, potassium hydroxide (KOH) and/or tetramethylammonium hydroxide (TMAH). Also, the removal can be performed using dry etching, including, but not necessarily limited to, reactive ion etching, or a combination of dry etching and wet etching. Alternatively, the selective deposition of a passivation layer over a set of the contacts 112 on a CNT layer 106 can be performed by masking a portion of the device that does not require a passivation layer (e.g., portion remaining as p-type) during the deposition of the passivation layer, followed by lifting off the mask layer (e.g., photoresist).

Like the resist 108, the mask 116 can comprise, but is not necessarily limited to, a photoresist, electron-beam resist, ion-beam resist, X-ray resist, and etchant resist, and may include a polymeric spin-on material or a polymeric material. The mask 116 can be deposited by any suitable method including, but not necessarily limited to, PECVD, ALD, or spin-coated and baked onto the underlying layer(s). According to an embodiment, the mask 116 comprises PMMA and has a shape defined by electron beam lithography. After selective removal of the passivation layer 114, the mask 116 can be removed using, for example, an ashing process, e-beam lithography or acetone.

As described in further detail in connection with FIG. 8, passivation layer 114 is removed over a portion of the device that is to have a transistor(s) of a different polarity than the transistor(s) where the passivation is not removed. For example, referring to FIG. 8, the passivation layer 114 is removed over what is to become a PFET portion of the device and remains over what is to become an NFET portion of the device.

Figure 8:
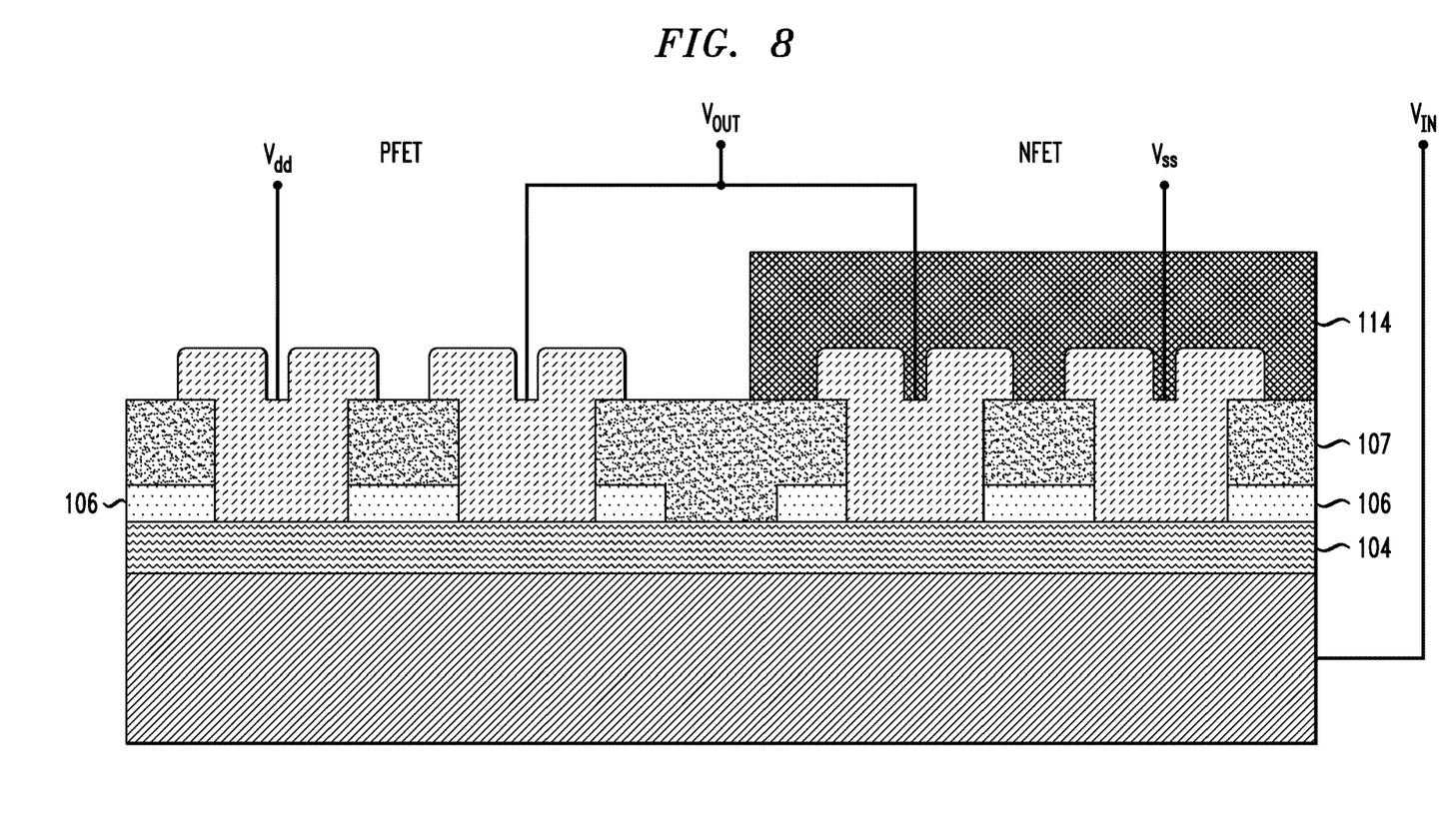
FIG. 8 is a cross-sectional view illustrating a device structure of an inverter with end-bonded p- and n-type contacts, according to an exemplary embodiment of the present invention.

FIG. 8 is a cross-sectional view illustrating a device structure of an inverter with end-bonded p- and n-type contacts, according to an exemplary embodiment of the present invention. Referring to FIG. 8, the remaining passivation layer 114 functions as an n-type physicochemical doping layer and enables the formation of robust n-type metal contacts end-bonded to CNTs by converting p-type contacts 112 to n-type contacts. Accordingly, an inverter is formed with both end-bonded p- and n-type contacts. Referring to FIG. 8, $V_{dd}$, $V_{IN}$, $V_{OUT}$, and $V_{ss}$ respectively represent positive supply, input, output and negative supply (or ground) voltages.

For the convenience of electrical probing and measurement, the contact pad (e.g., non-device) area may be opened by wet etching to selectively remove part of the passivation layer 114.

Figure 9A:
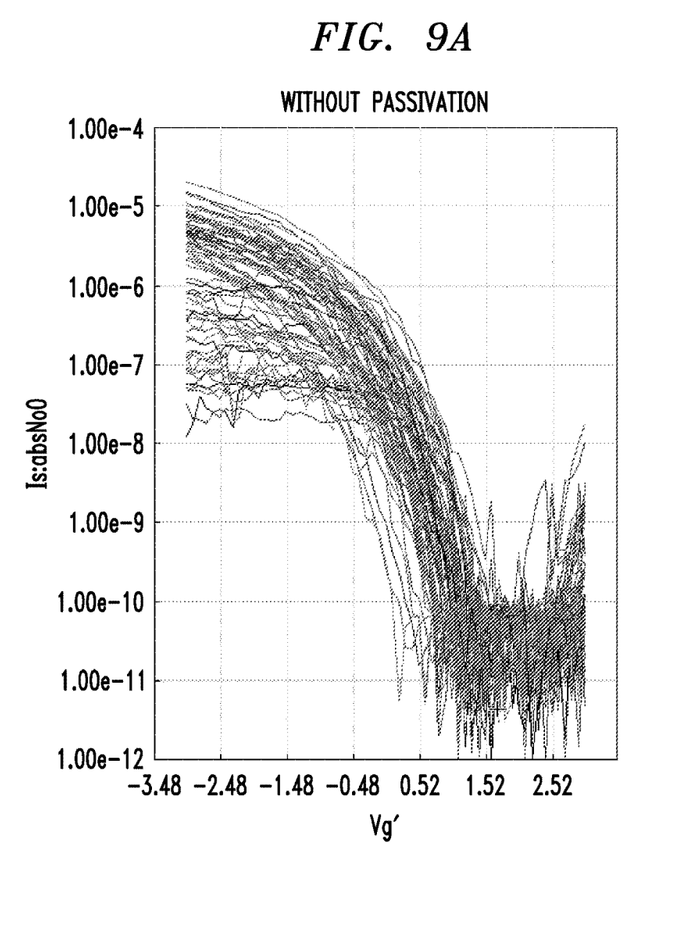
FIGS. 9A and 9B show graphs of source/drain current versus gate voltage of several CNT transistors in connection with end-bonded metal contacts without the passivation layer and with the passivation layer, according to an exemplary embodiment of the present invention.
Figure 9B:
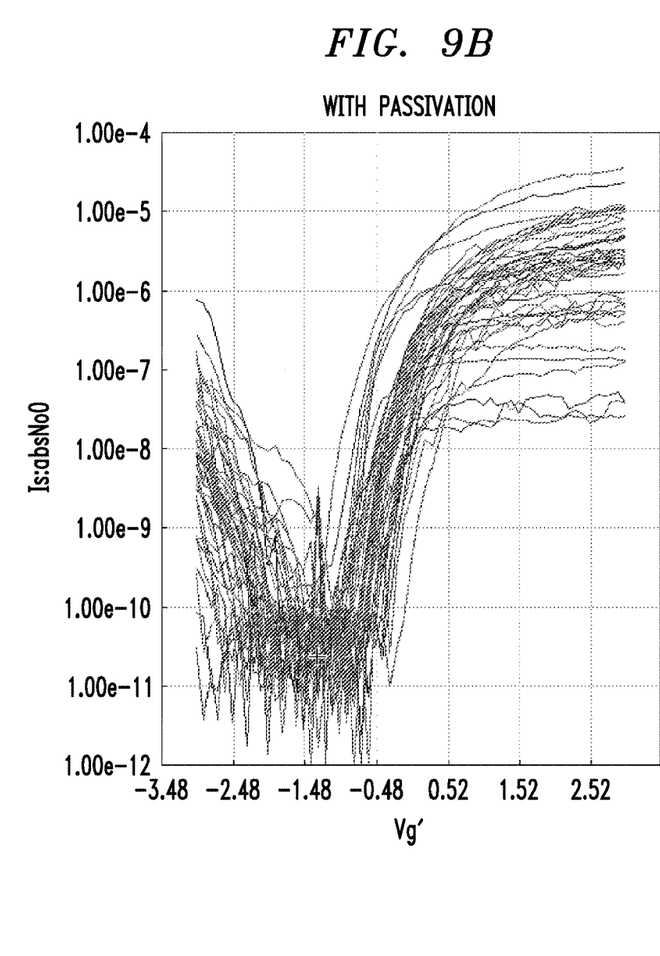

FIGS. 9A and 9B show graphs of source/drain current versus gate voltage in connection with end-bonded metal contacts without the passivation layer and with the passivation layer, according to an exemplary embodiment of the present invention. As can be seen in a comparison of FIGS. 9A and 9B, CNT transistors without a passivation layer (e.g., passivation layer 114) deposited thereon exhibit substantially complementary profiles to CNT transistors with a passivation layer due to the difference in doping (e.g., p-type vs. n-type) between the sets of transistors represented in FIGS. 9A and 9B.

Figure 10A:
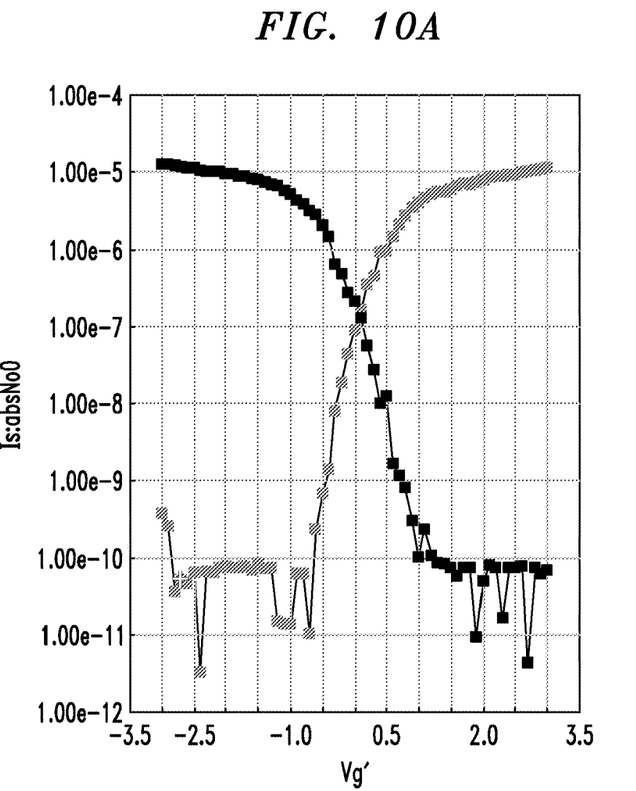
FIG. 10A shows a graph of source/drain current versus gate voltage of a PFET and NFET in an exemplary CNT inverter with end-bonded contacts in connection with FIG. 10B, according to an exemplary embodiment of the present invention.
Figure 10B:
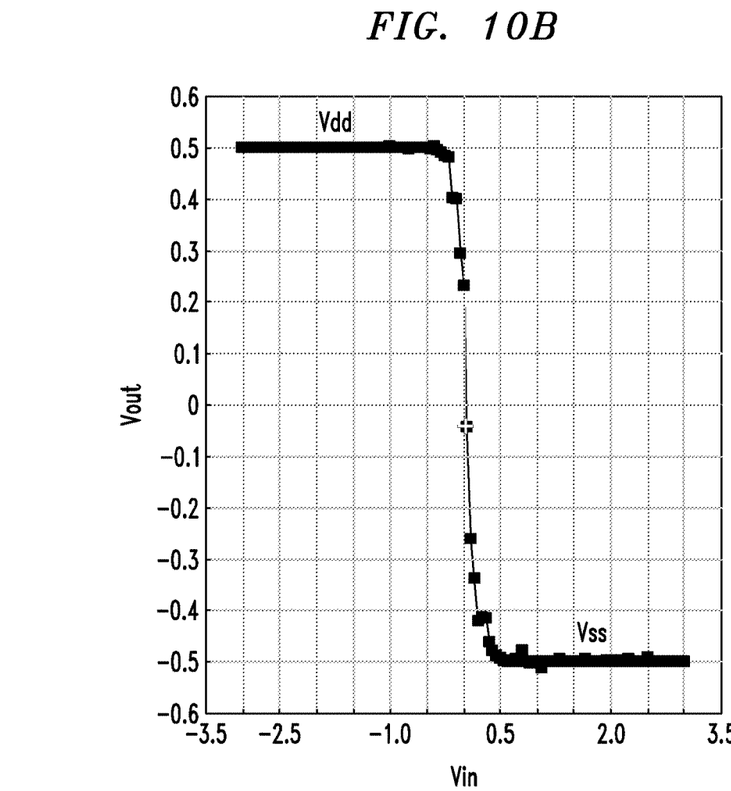
FIG. 10B shows a graph of output voltage versus input voltage to illustrate output characteristics of an exemplary inverter, according to an exemplary embodiment of the present invention.

FIG. 10A shows a graph of source/drain current versus gate voltage of a PFET and NFET in an exemplary CNT inverter with end-bonded contacts in connection with FIG. 10B, according to an exemplary embodiment of the present invention.

FIG. 10B shows a graph of output voltage versus input voltage to illustrate output characteristics of an inverter, according to an exemplary embodiment of the present invention. FIG. 10B demonstrates the correction functionality of a CMOS inverter.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a first dielectric layer on a substrate;
    forming a first carbon nanotube (CNT) layer on the first dielectric layer at a first portion of the device corresponding to a first doping type, wherein a diameter of the first carbon nanotube (CNT) layer is about 1 nanometer;
    forming a second carbon nanotube (CNT) layer on the first dielectric layer at a second portion of the device corresponding to a second doping type, wherein a diameter of the second carbon nanotube (CNT) layer is about 1 nanometer;
    forming a second dielectric layer on the first and second carbon nanotube (CNT) layers;
    patterning a plurality of trenches in the second dielectric layer, wherein the second dielectric layer comprises hydrogen silsesquioxane (HSQ);
    forming a plurality of first contacts on top of the patterned second dielectric layer and in a first group of the plurality of trenches on the first carbon nanotube (CNT) layer at the first portion of the device corresponding to the first doping type, and a plurality of second contacts on top of the patterned second dielectric layer and in a second group of the plurality of trenches on the second carbon nanotube (CNT) layer at the second portion of the device corresponding to the second doping type;
    wherein the plurality of the first and the second contacts comprise nickel;
    wherein a contact length of each of the plurality of the first and the second contacts is about 10 nanometers to about 100 nanometers;
    performing a thermal annealing process to create end-bonds, wherein the thermal annealing process is performed at a temperature of about 400° C. to about 600° C.;
    wherein performing the thermal annealing process comprises dissolving a portion of the first carbon nanotube (CNT) layer and a portion of the second carbon nanotube (CNT) layer into the plurality of the first contacts and the plurality of second contacts, respectively, to modify the plurality of the first and the second contacts;
    wherein the end-bonds are formed between the modified plurality of the first and the second contacts and the first and second carbon nanotube (CNT) layers, respectively;
    wherein the modified plurality of the first contacts and the modified plurality of the second contacts each comprise the dissolved portions of the first and second carbon nanotube (CNT) layers and a same metal material;
    depositing a passivation layer on the patterned second dielectric layer and on the modified plurality of the first and second contacts;
    selectively removing a portion of the passivation layer off of the modified plurality of first contacts; and
    forming an inverter using the modified plurality of the first and the second contacts;
    wherein the modified plurality of the second contacts are covered by the remaining portion of the passivation layer; and
    wherein bottom surfaces of the modified plurality of the first and second contacts are positioned on a top surface of the first dielectric layer.

2. The method according to claim 1, wherein the first doping type and the second doping type respectively comprise p-type and n-type.

3. The method according to claim 1, wherein the passivation layer comprises aluminum oxide ($Al_2O_3$).

4. The method according to claim 3, wherein the passivation layer is deposited using atomic layer deposition (ALD).

5. The method according to claim 1, wherein the portion of the passivation layer is selectively removed using a buffered oxide etch (BOE) process.

6. The method according to claim 1, further comprising depositing a mask on another portion of the passivation layer corresponding to the modified plurality of second contacts and the second carbon nanotube (CNT) layer prior to selectively removing the portion of the passivation layer off of the modified plurality of first contacts.

7. The method according to claim 6, wherein the mask comprises polymethyl methacrylate (PMMA).

8. The method according to claim 7, wherein a shape of the mask is defined by electron beam lithography.

9. The method according to claim 1, wherein the first carbon nanotube (CNT) layer is spaced apart from the second carbon nanotube (CNT) layer.

10. The method according to claim 1, wherein the end-bonds each comprise an interface between an end on a lateral side of one of a first contact and a second contact of the modified plurality of the first and the second contacts and an end on a lateral side of a remaining portion of one of the first carbon nanotube (CNT) layer and the second carbon nanotube (CNT) layer.

11. The method according to claim 10, wherein the patterned second dielectric layer is positioned between the one of the first contact and the second contact and the remaining portion of one of the first carbon nanotube (CNT) layer and the second carbon nanotube (CNT) layer.

12. The method according to claim 10, wherein the patterned second dielectric layer is directly on the remaining portion of one of the first carbon nanotube (CNT) layer and the second carbon nanotube (CNT) layer.

13. A method for manufacturing a semiconductor device, comprising:
    forming a first dielectric layer on a substrate;
    forming a first carbon nanotube (CNT) layer on the first dielectric layer at a first portion of the device corresponding to a first doping type, wherein a diameter of the first carbon nanotube (CNT) layer is about 1 nanometer;
    forming a second carbon nanotube (CNT) layer on the first dielectric layer at a second portion of the device corresponding to a second doping type, wherein a diameter of the second carbon nanotube (CNT) layer is about 1 nanometer;

forming a second dielectric layer on the first and second carbon nanotube (CNT) layers;

patterning a plurality of trenches in the second dielectric layer, wherein the second dielectric layer comprises hydrogen silsesquioxane (HSQ);

forming a plurality of first contacts on top of the patterned second dielectric layer and in a first group of the plurality of trenches on the first carbon nanotube (CNT) layer at the first portion of the device corresponding to the first doping type, and a plurality of second contacts on top of the patterned second dielectric layer and in a second group of the plurality of trenches on the second carbon nanotube (CNT) layer at the second portion of the device corresponding to the second doping type;

wherein the plurality of the first and the second contacts comprise nickel;

wherein a contact length of each of the plurality of the first and the second contacts is about 10 nanometers to about 100 nanometers;

performing a thermal annealing process to create end-bonds, wherein the thermal annealing process is performed at a temperature of about 400° C. to about 600° C.;

wherein performing the thermal annealing process comprises dissolving a portion of the first carbon nanotube (CNT) layer and a portion of the second carbon nanotube (CNT) layer into the plurality of the first contacts and the plurality of second contacts, respectively, to modify the plurality of the first and the second contacts;

wherein the modified plurality of the first contacts and the modified plurality of the second contacts each comprise the dissolved portions of the first and second carbon nanotube (CNT) layers and a same metal material;

wherein the modified plurality of the first contacts and the modified plurality of the second contacts are respectively formed between portions of the patterned second dielectric layer;

wherein the portions of the patterned second dielectric layer cover remaining portions of the first and second carbon nanotube (CNT) layers not dissolved by the thermal annealing process;

wherein the end-bonds are formed between ends on lateral sides of the remaining portions of the first and second carbon nanotube (CNT) layers and ends on lateral sides of bottom portions of the modified plurality of the first contacts and the modified plurality of the second contacts;

depositing a passivation layer on the patterned second dielectric layer and on the modified plurality of the first and second contacts;

selectively removing a portion of the passivation layer off of the modified plurality of first contacts; and forming an inverter using the modified plurality of the first and the second contacts;

wherein the modified plurality of the second contacts are covered by the remaining portion of the passivation layer; and wherein bottom surfaces of the modified plurality of the first and second contacts are positioned on a top surface of the first dielectric layer.

14. The method according to claim 13, wherein the portions of the patterned second dielectric layer are positioned between the remaining portions of the first and second carbon nanotube (CNT) layers and one of a first contact and a second contact of the modified plurality of the first and the second contacts.

15. The method according to claim 13, wherein the portions of the patterned second dielectric layer are directly on the remaining portions of the first and second carbon nanotube (CNT) layers.

\* \* \* \* \*